US012051684B2

(12) United States Patent
Paek et al.

(10) Patent No.: US 12,051,684 B2
(45) Date of Patent: Jul. 30, 2024

(54) FACE-TO-FACE SEMICONDUCTOR DEVICE WITH FAN-OUT PORCH

(71) Applicant: Micron Technology, Inc., Boise, ID (US)

(72) Inventors: Jong Sik Paek, Taichung (TW); Yeongbeom Ko, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/241,592

(22) Filed: Sep. 1, 2023

(65) Prior Publication Data

US 2023/0420440 A1 Dec. 28, 2023

Related U.S. Application Data

(60) Continuation of application No. 17/952,563, filed on Sep. 26, 2022, now Pat. No. 11,749,665, which is a
(Continued)

(51) Int. Cl.
*H01L 25/18* (2023.01)
*H01L 23/00* (2006.01)
(Continued)

(52) U.S. Cl.
CPC .............. *H01L 25/18* (2013.01); *H01L 24/05* (2013.01); *H01L 24/13* (2013.01); *H01L 24/16* (2013.01); *H01L 24/48* (2013.01); *H01L 24/49* (2013.01); *H01L 24/73* (2013.01); *H01L 25/50* (2013.01); *H01L 23/49827* (2013.01); *H01L 2224/02122* (2013.01); *H01L 2224/0231* (2013.01);
(Continued)

(58) Field of Classification Search
CPC .......... H01L 25/18; H01L 24/05; H01L 24/13
See application file for complete search history.

(56) References Cited

U.S. PATENT DOCUMENTS 11,456,289 B2  9/2022 Paek et al.
2003/0057539 A1  3/2003 Koopmans
(Continued)

FOREIGN PATENT DOCUMENTS

WO   2012107972 A1   8/2012

OTHER PUBLICATIONS

KR Patent Application No. 10-2020-0182022—Korean Office Action and Search Report, dated Sep. 6, 2022, with English Translation, 17 pages.

(Continued)

*Primary Examiner* — Errol V Fernandes

(74) *Attorney, Agent, or Firm* — Perkins Coie LLP

(57) ABSTRACT

Semiconductor device assemblies can include a substrate having a substrate contact. The assemblies can include a first semiconductor device and a second semiconductor device arranged in a face-to-face configuration. The assemblies can include a fan-out porch on the substrate at a lateral side of the first semiconductor device and including a wirebond contact, the wirebond contact being electrically coupled to the first semiconductor device. The assemblies can include a wirebond operably coupling the wirebond contact to the substrate contact. The assemblies can include a pillar or
(Continued)

bump operably coupling the active side of the first semiconductor device to the active side of the second semiconductor device. In some embodiments, the wirebond contact is operably couple to the active side of the first semiconductor device.

16 Claims, 6 Drawing Sheets

Related U.S. Application Data division of application No. 16/728,955, filed on Dec. 27, 2019, now Pat. No. 11,456,289.

(51) Int. Cl.
    *H01L 25/00*     (2006.01)
    *H01L 23/498*     (2006.01)
(52) U.S. Cl.
    CPC ........... *H01L 2224/02379* (2013.01); *H01L 2224/02381* (2013.01); *H01L 2224/13147* (2013.01); *H01L 2224/16145* (2013.01); *H01L 2224/48106* (2013.01); *H01L 2224/48227* (2013.01); *H01L 2224/49175* (2013.01); *H01L 2224/73207* (2013.01)

(56) References Cited

U.S. PATENT DOCUMENTS

| | | |
|---|---|---|
| 2008/0265400 A1 | 10/2008 | Pan et al. |
| 2008/0272465 A1 | 11/2008 | Do et al. |
| 2009/0230548 A1 | 9/2009 | Park et al. |
| 2009/0321951 A1 | 12/2009 | Takiar et al. |
| 2013/0299957 A1 | 11/2013 | Kobayashi et al. |
| 2015/0311185 A1 | 10/2015 | Ng et al. |
| 2017/0345796 A1 | 11/2017 | Saugier |
| 2021/0202454 A1 | 7/2021 | Paek et al. |
| 2023/0013960 A1 | 1/2023 | Paek et al. |

OTHER PUBLICATIONS

TW Patent Application No. 109145742—Taiwanese Office Action and Search Report, dated Dec. 6, 2021, with English Translation, 14 pages.
TW Patent Application No. 109145742—Taiwanese Office Action, dated Jun. 21, 2022, with English Translation, 14 pages.

FACE-TO-FACE SEMICONDUCTOR DEVICE WITH FAN-OUT PORCH

CROSS-REFERENCE TO RELATED APPLICATIONS

This application is a continuation of U.S. patent application Ser. No. 17/952,563, filed Sep. 26, 2022; which is a division of U.S. patent application Ser. No. 16/728,955, filed Dec. 27, 2019, now U.S. Pat. No. 11,456,289; each of which is incorporated herein by reference in its entirety.

TECHNICAL FIELD

The embodiments described herein relate to semiconductor devices, semiconductor device assemblies, and methods of providing such semiconductor devices and semiconductor device assemblies.

BACKGROUND

Semiconductor device assemblies, including, but not limited to, memory chips, microprocessor chips, imager chips, and the like, typically include a semiconductor device having a die mounted on a substrate. Semiconductor devices may include various functional features, such as memory cells, processor circuits, and imager devices, and bond pads that are electrically connected to the functional features. Semiconductor device assemblies may include several semiconductor devices stacked upon and electrically connected to one another by individual interconnects between adjacent devices within a package.

Various methods and/or techniques may be employed to electrically interconnect adjacent semiconductor devices and/or substrates in a semiconductor device assembly. For example, wirebonds may connect pads on various dies, substrates, and other components to each other. The wirebonds may connect components to each other in series and/or in parallel.

Figure 1:
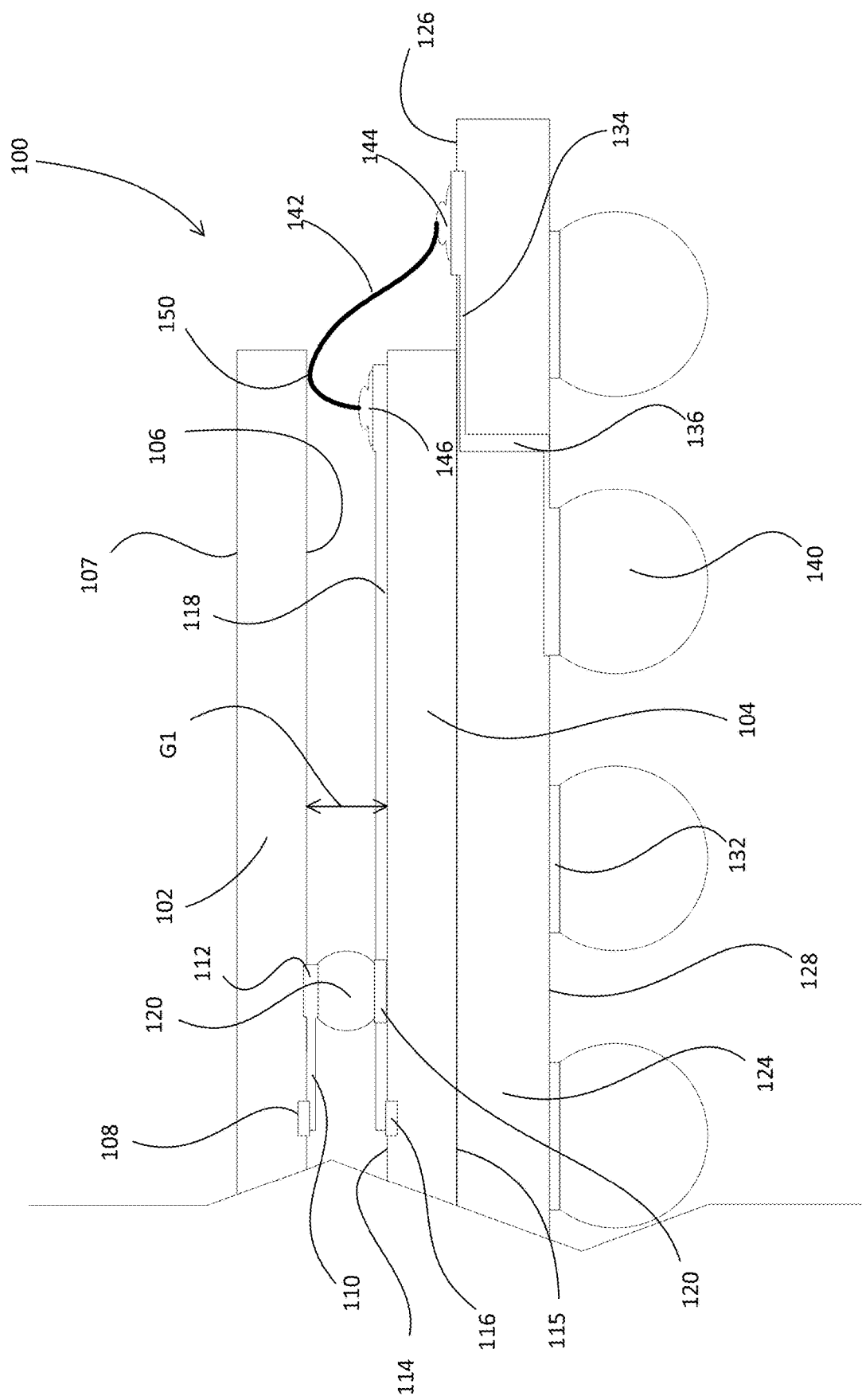
FIG. 1 is a cross-sectional schematic of an exemplary semiconductor device assembly.

The present technology is described below with respect to specific embodiments that are shown by way of example in the drawings, but the present technology has various modifications and alternate forms. The following disclosure is accordingly not intended to be limited to the particular examples disclosed. Rather, the intention is to cover all modifications, equivalents and alternatives falling within the scope of the disclosure as defined by the appended claims.

DETAILED DESCRIPTION

Numerous specific details are described herein to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. A semiconductor device assembly may be manufactured as, but is not limited to, a discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise be incorporated within the housing or casing.

As used in the foregoing description, the terms "vertical," "lateral," "upper," and "lower" can refer to relative directions or positions of features in the semiconductor devices in view of the orientation shown in the figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein Semiconductor devices (e.g., dies, modules, packages, etc.) often have an active side (e.g., a "front side" or "face") and a back side. The active side can include active circuits (e.g., providing functional features such as memory cells, processor circuits, and/or imager devices) and/or passive features (e.g., capacitors, resistors, through-silicon vias (TSVs), etc.) as well as bond pads electrically connected to the circuits. The back side can be a wafer, encapsulant, or another feature. In some embodiments, the back side encapsulates or partially encapsulates one or more of the active and/or passive features of the active side and can include one or more active circuits and/or passive features passing at least partially therethrough. Some semiconductor devices may be arranged in a so-called "face-to-face" arrangement wherein the active sides of two stacked devices face each other to allow for shorter connectors between the active sides of the stacked devices and to reduce the need for TSVs or other through vias to connect the active sides to each other. Reducing the number of vias in favor of direct connection between the active sides of the semiconductor devices can reduce the overall cost and/or mechanical complexity of the semiconductor device assembly.

Various embodiments of this disclosure are directed to semiconductor devices, semiconductor device assemblies, and methods of making and/or operating semiconductor devices and/or semiconductor device assemblies that have reduced spacing between semiconductor devices. More specifically, embodiments of the present disclosure can include fan-out porches spaced outside the perimeters of face-to-face semiconductor devices that allow wirebonds to be formed between base substrates of the disclosed semiconductor device assemblies and the active side of devices adjacent the porches, without requiring the wirebonds to extend between the face-to-face semiconductor devices. Forming the wirebonds outside of the space between the face-to-face semiconductor devices reduce gap size between the face-to-face semiconductor devices since the gap do not need to accommodate the wirebond (e.g., the bend or loop formed by the wirebond). In this regard, several embodiments of the present technology are directed to semiconductor device assemblies that include a substrate having a first side, a second side opposite the first side, and a substrate contact on the first side. The assemblies can include a first semiconductor device on the first side of the substrate. The first semiconductor device can include an active side having a first bond pad, and a back side opposite the active side and facing the first side of the substrate. In some embodiments, the assemblies include a second semiconductor device having an active side having a second bond pad and facing the active side of the first semiconductor device and a back side opposite the active side. The assemblies can include a conductive connector operably coupling the first bond pad to the second bond pad. In some embodiments, the assemblies include a fan-out porch on the substrate and positioned adjacent a lateral side of the first semiconductor device. The assemblies can include a wirebond contact on the fan-out porch electrically coupled to the first semiconductor device, the wirebond contact positioned outside of a footprint of the second semiconductor device as observed normal to the active side of the first semiconductor device. In some embodiments, the assemblies include a wirebond connecting the wirebond contact to the substrate contact.

In yet further embodiments, semiconductor device assemblies can include a substrate having a substrate contact. The assemblies can include a first semiconductor device having an active side and a back side opposite the active side. In some embodiments, the assemblies include a second semiconductor device comprising an active side facing the active side of the first semiconductor device and a back side opposite the active side of the second semiconductor device. The assemblies can include a fan-out porch on the substrate at a lateral side of the first semiconductor device and including a wirebond contact, the wirebond contact being electrically coupled to the first semiconductor device. The assemblies can include a wirebond operably coupling the wirebond contact to the substrate contact and a pillar or bump operably coupling the active side of the first semiconductor device to the active side of the second semiconductor device. In some embodiments, the wirebond contact is operably couple to the active side of the first semiconductor device.

Methods of assembling a semiconductor device assembly can include operably coupling a first semiconductor device to a substrate. These methods can include operably coupling a second semiconductor device to the first semiconductor device in a face-to-face arrangement such that an active side of the first semiconductor device faces an active side of the second semiconductor device. In some embodiments, the methods include forming a fan-out porch on the substrate at a lateral edge of the first semiconductor device and connecting a wirebond to a substrate contact on the substrate and to a wirebond contact on the fan-out porch.

FIG. 1 is a cross-sectional schematic view of an exemplary semiconductor device assembly 100 having a first semiconductor device 102 (e.g., an upper semiconductor device) and a second semiconductor device 104 (e.g., a lower semiconductor device) arranged in a face-to-face configuration. The first semiconductor device 102 includes an active side 106 having conductive components and a back side 107 opposite the active side 106. The active side 106 of the first semiconductor device 102 can include one or more die pads 108, redistribution layers (RDLs) 110, and/or bond pads 112. Similarly, the second semiconductor device 104 can include an active side 114 and a back side 115, die pads 116 at the active side 114, RDLs 118, and/or bond pads 120. The respective active sides 106, 114 of the first and second semiconductor devices 102, 104 face each other and can be connected via a solder ball 120 or other connector (e.g., a pillar). The solder ball 120 can be formed on the bond pads 112, 120. The RDL 110 of the first semiconductor device 102 can be connected to one or both of the die pad 108 and bond pad 112. Similarly, the RDL 118 of the second semiconductor device 104 can be connected to one or both of the die pad 116 and the bond pad 120.

The face-to-face semiconductor devices 102, 104 can be arranged on a substrate 124 having a first side 126 (e.g., a top side) and a second side 128 (e.g., a bottom side) opposite the first side 126. The back side 115 of the second semiconductor device 104 can be adjacent or on the first side 126 of the substrate 124. The first side 126 of the substrate 124 can include one or more bond pads 130. The one or more bond pads 130 can be operably connected to one or more pads 132 on the second side 128 of the substrate 124 via one or more interconnects 134 and/or vias 136 (e.g., TSVs, through-wafer vias, or other vias) in the substrate 124. Solder balls 140 and/or other connection structures may be formed on the second side 128 (e.g., on the pads 136) of the substrate 124 to connect the semiconductor assembly 100 to other semiconductor devices or assemblies.

The second semiconductor device 104 can be operably coupled to the substrate 124 via one or more wirebonds 142 extending from a substrate contact 144 on the first side 126 of the substrate 124 and a contact 146 on the active side 114 of the second semiconductor device 104. The contact 146 is positioned between the first and second semiconductor devices 102, 104 (e.g., vertically aligned with both the first and second semiconductor devices 102, 104). To accommodate the bend 150 in the wirebond 142 between the substrate contact 144 and the contact 146, a gap G1 is maintained between the active side 106 of the first semiconductor device 102 and the active side 114 of the second semiconductor device 104. The minimum gap G1 that can be used to accommodate the bend 150 can be greater than 65 microns, greater than 70 microns, greater than 75 microns, greater than 80 microns, and/or greater than 90 microns. The size of the gap G1 between the semiconductor devices 102, 104 directly correlates to the distance between the bond pad 112 on the active side of the first semiconductor device 102 and the bond pad 120 on the active side 114 of the second semiconductor device 104, which further correlates to the needed size/height of the solder bump 120, pillar, or other connection between the bond pads 112, 120.

In some embodiments, reducing the gap G1 between the active side 106 of the first semiconductor device 102 and the active side 114 of the second semiconductor device 104 is desirable to reduce the height of the connecting structure between the bond pad 112 on the active side of the first semiconductor device 102 and the bond pad 120 on the active side 114 of the second semiconductor device 104. For example, reducing the size and/or height of copper pillars or copper pillar bumps between the bond pad 112 on the active side of the first semiconductor device 102 and the bond pad 120 on the active side 114 of the second semiconductor device 104 can reduce the costs associated with the materials in those pillars/bumps and increase the mechanical durability of the pillars/bumps. Reducing the height of the pillars/bumps can also increase the quality of the operable connection between the bond pads 112, 120 by reducing the length of the connection therebetween.

Figure 2:
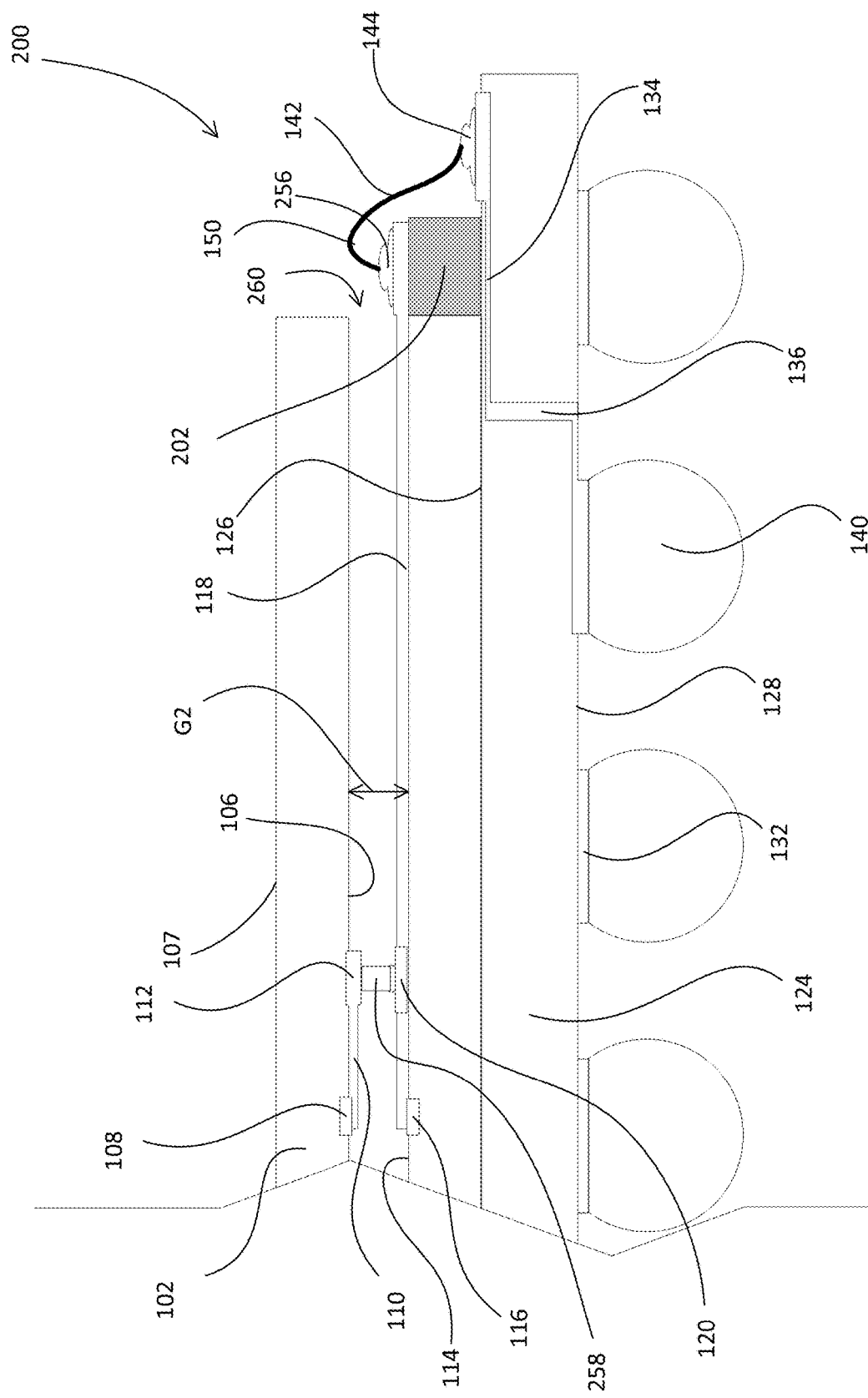
FIG. 2 is a cross-sectional schematic of an embodiment of a semiconductor device assembly.

FIG. 2 illustrates an embodiment of a semiconductor device assembly 200 that includes many of the same or similar features as those described above with respect to FIG. 1, as reflected in the use of like reference numbers to identify like components between the semiconductor device assembly 100 and the semiconductor device assembly 200. The semiconductor device assembly 200 includes a fan-out porch 202 adjacent and/or in contact with an outer edge of the second semiconductor device 104. As used herein, a "porch" can refer to a portion of material positioned laterally-adjacent to a substrate or other semiconductor structure and extending beyond the footprint of a substrate or die positioned above the porch. The fan-out porch 202 can be adjacent or on the first side 126 of the substrate 124. The fan-out porch 202 can have a height, as measured normal to the first side of the substrate 124, equal to or approximately equal to a height of the second semiconductor device 104, as measured normal to the first side of the substrate 124.

The fan-out porch 202 can be formed from a molding material (e.g., an epoxy, resin, or some other material or combination of materials). Such molding materials can be low cost. The fan-out porch 202 can be added to the semiconductor device assembly 200 before or after connecting the bond pad 112 on the active side of the first semiconductor device 102 to the bond pad 120 on the active side 114 of the second semiconductor device 104. In some embodiments, the RDL 118 at the active side 114 of the second semiconductor device 104 is extended onto the fan-out porch 202 (e.g., on a side of the fan-out porch 202 opposite the substrate 124). The wirebond connection 142 can be made between the substrate contact 144 on the first side 126 of the substrate 124 and a contact 256 on the side of the fan-out porch 202 opposite the substrate 124, thereby positioning the wirebond 142 and bend 150 laterally apart from the space between the first semiconductor device 102 and the second semiconductor device 104. Positioning the wirebond 142 laterally apart from between the first semiconductor device 102 and the second semiconductor device 104 allows for a smaller gap G2 between the active surface 106 of the first semiconductor device 102 and the active surface 114 of the second semiconductor device 104. For example, the gap G2 can be less than 60 microns, less than 55 microns, less than 50 microns, less than 45 microns, less than 40 microns, less than 30 microns, and/or less than 25 microns. In some embodiments, the gap G2 is between 20-50 microns, between 24-40 microns, and/or between 30-60 microns. Reducing the gap G2 can allow a short/small copper pillar 258 or copper pillar bump to be used to operably couple the RDL 110 of the first semiconductor device 102 to the RDL 118 of the second semiconductor device 104 via the bond pads 112, 120. As explained above, reducing the size and/or height of copper pillars or copper pillar bumps between the bond pad 112 on the active side of the first semiconductor device 102 and the bond pad 120 on the active side 114 of the second semiconductor device 104 (e.g., as realized via use of the fan-out porch 202) can reduce the costs associated with the materials in those pillars/bumps and increase the mechanical durability of the pillars/bumps. Reducing the height of the pillars/bumps can also increase the quality of the operable connection between the bond pads 112, 120 by reducing the length of the connection therebetween Moving the contact 256 of the wirebond 142 out from the space between the first semiconductor device 102 and the second semiconductor device 104 can move the wirebond 142 away from the interface 260 between the space between the semiconductor devices 102, 104 and the surrounding environment. This can allow for faster and more uniform underfill or other material deposition (e.g., by avoiding the wirebond 142) between the active side 106 of the first semiconductor device 102 and the active side 114 of the second semiconductor device 104.

Figure 3:
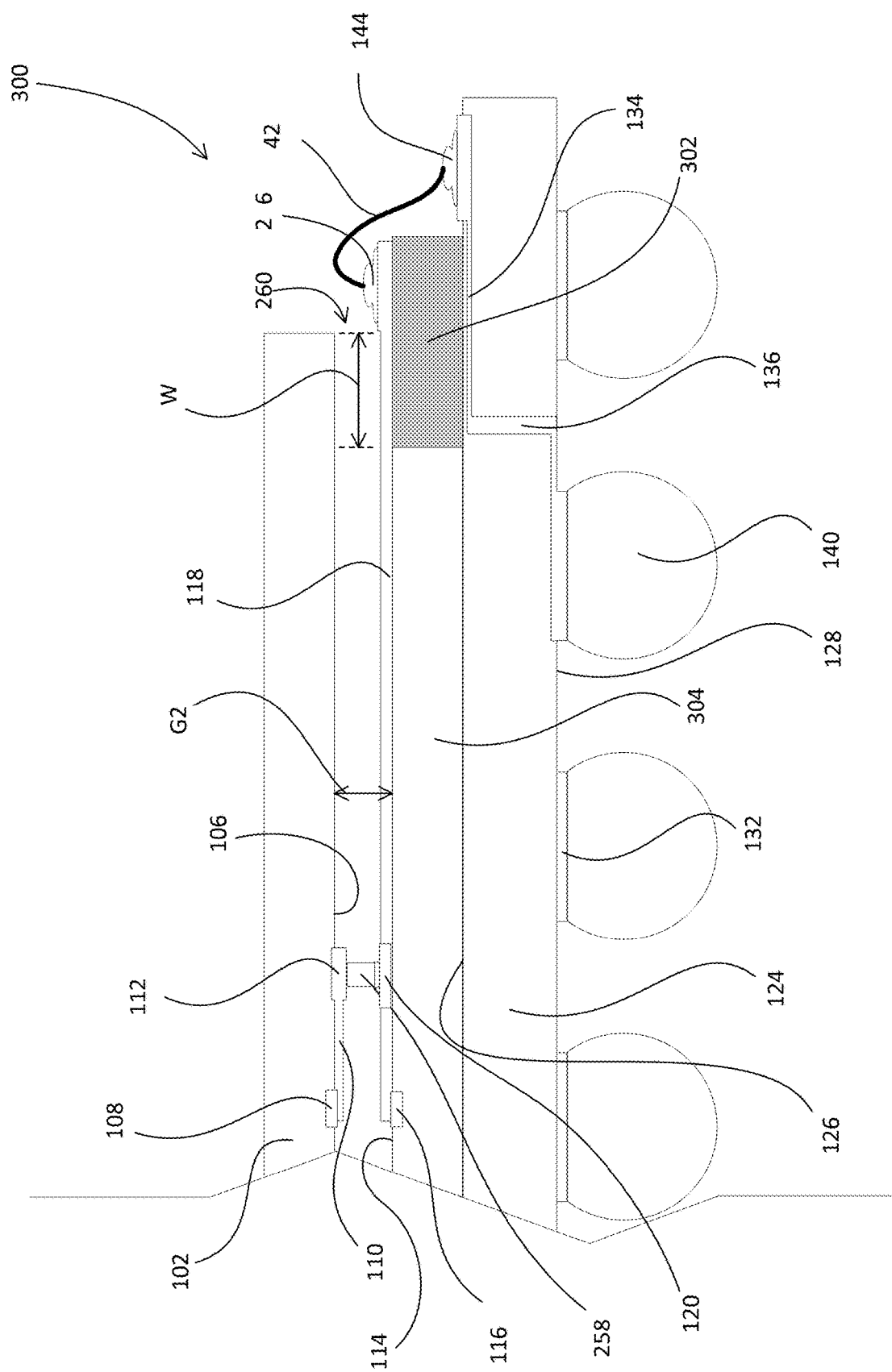
FIG. 3 is a cross-sectional schematic of an embodiment of a semiconductor device assembly.

FIG. 3 illustrates an embodiment of a semiconductor device assembly 300 that includes many of the same or similar features as those described above with respect to FIG. 1, as reflected in the use of like reference numbers to identify like components between the semiconductor device assembly 100 and the semiconductor device assembly 300. The semiconductor device assembly 300 includes a second semiconductor device 304 which is recessed laterally from the first semiconductor device 102 along at least a portion of an edge of the second semiconductor device 304. The lateral width W of the recess can vary depending on the relative size and/or position of the first semiconductor device 102 with respect to the second semiconductor device 304. For example, the first semiconductor device 102 may have an overall larger footprint than the second semiconductor device 304, as observed normal to the first side 126 of the substrate 124. In some applications, the first and second semiconductor devices 102, 304 are arranged in a shingled or other offset arrangement to create the overhang therebetween.

As with the fan-out porch 202 described above, the fan-out porch 302 of FIG. 3 can be manufactured before or after connecting the bond pad 112 on the active side of the first semiconductor device 102 to the bond pad 120 on the active side 114 of the second semiconductor device 304. The fan-out porch 302 is manufactured/formed to have a sufficient width (as measured parallel to the first side 126 of the substrate 124) to position the contact 256 on the fan-out porch 302 outside (e.g., spaced laterally apart from) of the space between the first semiconductor device 102 and the second semiconductor device 304. The fan-out porch 302 can have a height, as measured normal to the first side of the substrate 124, equal to or approximately equal to a height of the second semiconductor device 304, as measured normal to the first side of the substrate 124.

Using fan-out porches 202, 302 as described herein can allow for face-to-face arrangement of semiconductor devices having respective misalignments and/or dissimilar footprints while positioning wirebond connections between the substrate 124 and the semiconductor devices outside of the space between the semiconductor devices. Using fan-out porches 202, 302 in these manners can reduce or eliminate the need for post-processing machining of the semiconductor devices 102, 104, 304 to move the wirebond out from the spaces between the semiconductor devices. In some embodiments, use of the fan-out porches 202, 302 facilitates assembly of a semiconductor device assembly having a small second semiconductor device (e.g., a controller) positioned between a substrate and a larger first semiconductor device (e.g., a memory stack). Such arrangements may be used, for example, in high-bandwidth memory (HBM) semiconductor device assemblies.

Figure 4A:
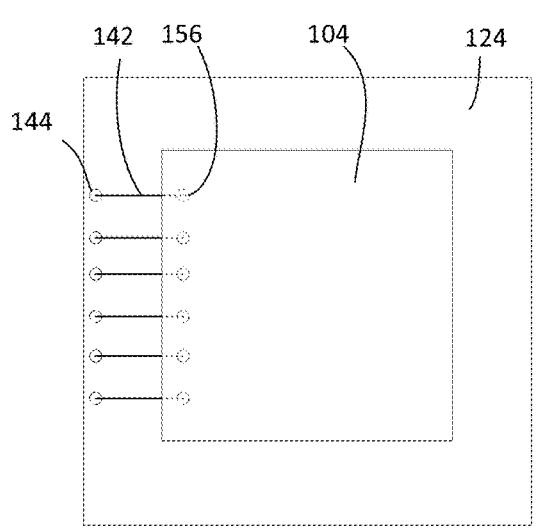
FIG. 4A is a top plan view of an embodiment of semiconductor device assembly.
Figure 4B:
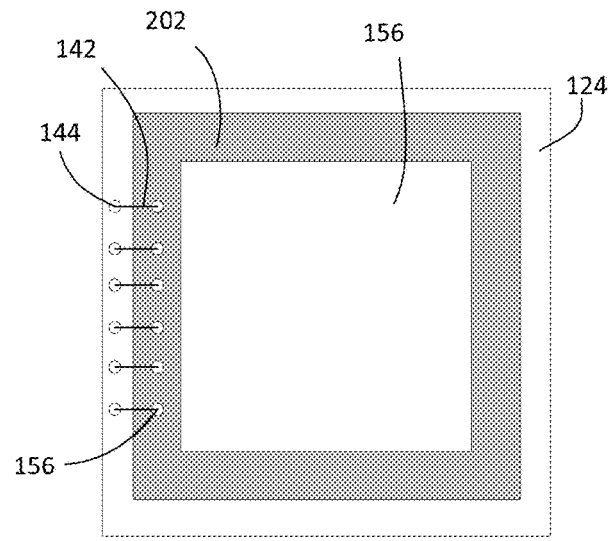
FIG. 4B is a top plan view of the semiconductor device assembly of FIG. 4A with a fan-out porch.

FIG. 4A illustrates a top plan view of the semiconductor device assembly 100, which does not include a fan-out porch. The wirebonds 142 extend from substrate contacts 144 on the substrate 124 to contacts 156 between the first and second semiconductor devices 102, 104. While wirebonds 142 are illustrated on a single lateral side of the semiconductor device assembly 100, other wirebonds 142 may be positioned on one or more of the other lateral sides of the semiconductor device assembly 100 without changing the principles described herein. As illustrated in FIG. 4B, the addition of a fan-out porch 202 to the semiconductor device assembly 200 can move the contacts 156 out from under the first semiconductor device 102.

Figure 4C:
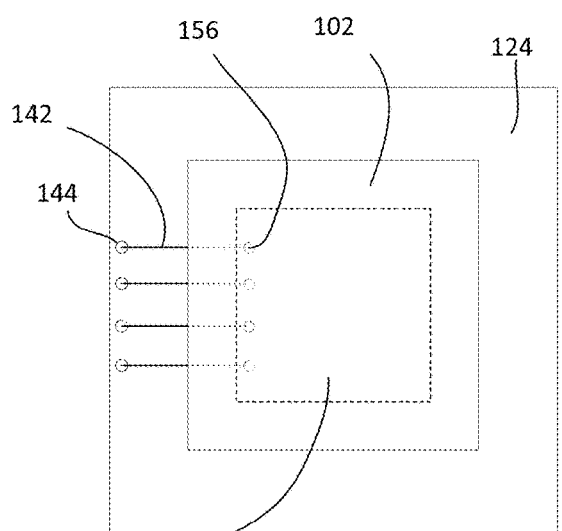
FIG. 4C is a top plan view of an embodiment of semiconductor device assembly.
Figure 4D:
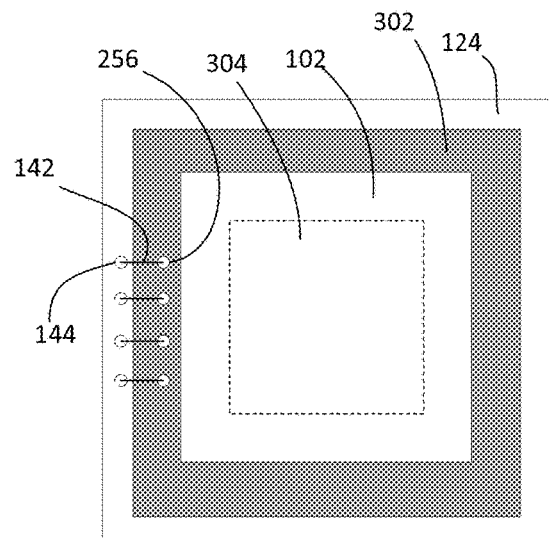
FIG. 4D is a top plan view of the semiconductor device assembly of FIG. 4C with a fan-out porch.

FIGS. 4C and 4D illustrate the semiconductor device assembly 300 with and without, respectively, the fan-out porch 302. As described above, the addition of the fan-out porch 302 allows the contacts 156 to be positioned out from under the first semiconductor device 102 (i.e., out from between the two semiconductor devices 102, 304). While wirebonds 142 are illustrated on a single lateral side of the semiconductor device assembly 300, other wirebonds 142 may be positioned on one or more of the other lateral sides of the semiconductor device assembly 300 without changing the principles described herein.

Figure 5:
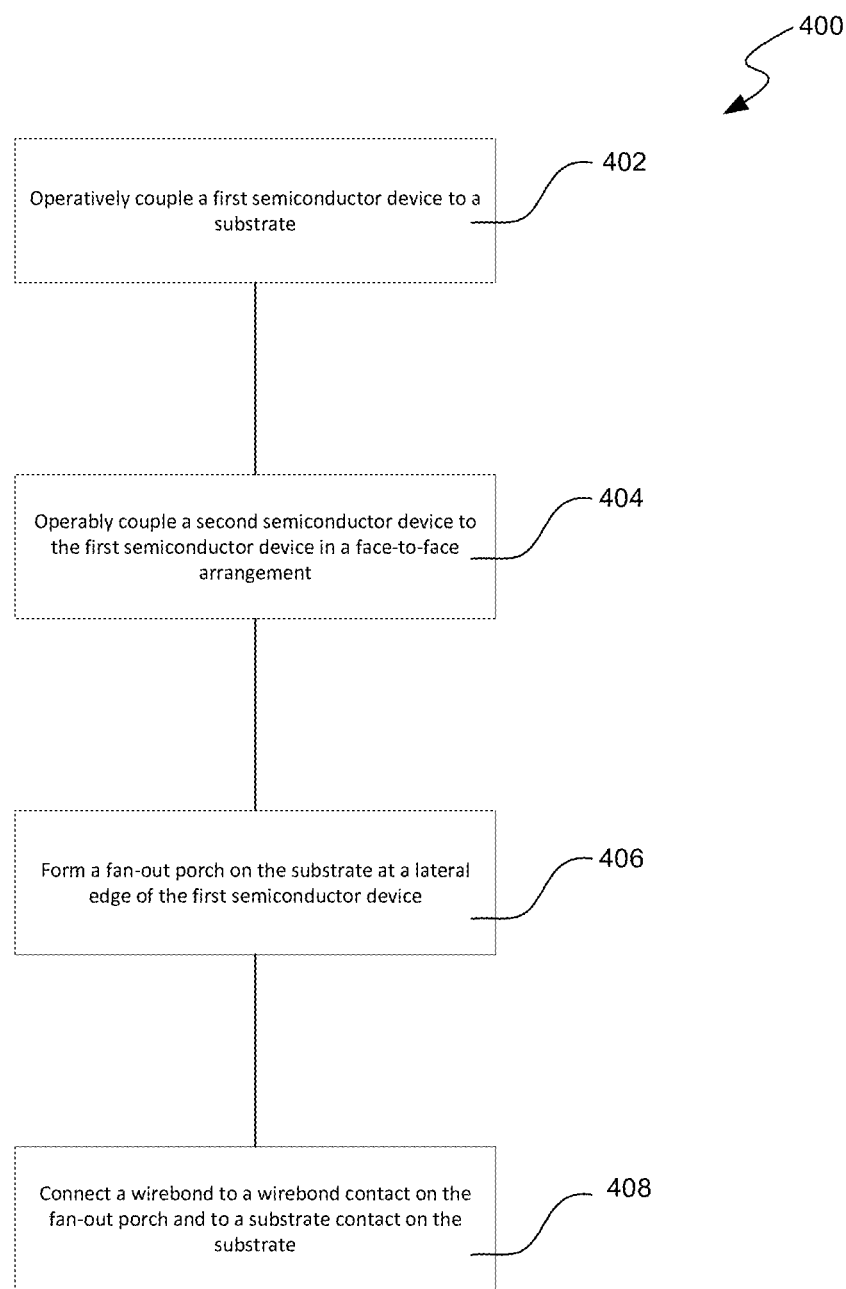
FIG. 5 is a flow chart of an embodiment of a method of assembling a semiconductor device assembly.

FIG. 5 is a flow chart of an embodiment of a method 400 of assembling a semiconductor device assembly. The method 400 can include operably coupling a first semiconductor device (e.g., one of the semiconductor devices 102, 104, 304 describe above) to a substrate (e.g., the substrate 124 described above) (block 402). The method 400 can include operably coupling a second semiconductor device (e.g., one of the semiconductor devices 102, 104, 304 describe above) to the first semiconductor device in a face-to-face arrangement such that an active side of the first semiconductor device faces an active side of the second semiconductor device (block 404). The method 400 can include forming a fan-out porch (e.g., one of the fan-out porches 202, 302 described above) on the substrate at a lateral edge of the first semiconductor device (block 406). In some embodiments, the method 400 includes connecting a wirebond to a substrate contact on the substrate and to a wirebond contact on the fan-out porch (block 408). As described above, the wirebond contact can be positioned outside a foot print of the second semiconductor device as observed normal to the active surface of the first semiconductor device. In some embodiments, one or more of the above-described steps of the method 400 can be performed in varying order. For example, the step described in block 406 can be performed before or after the step described in block 404. In some case, the step described in block 404 can be performed before or after one or both of the steps described in blocks 402 and 406.

Figure 6:
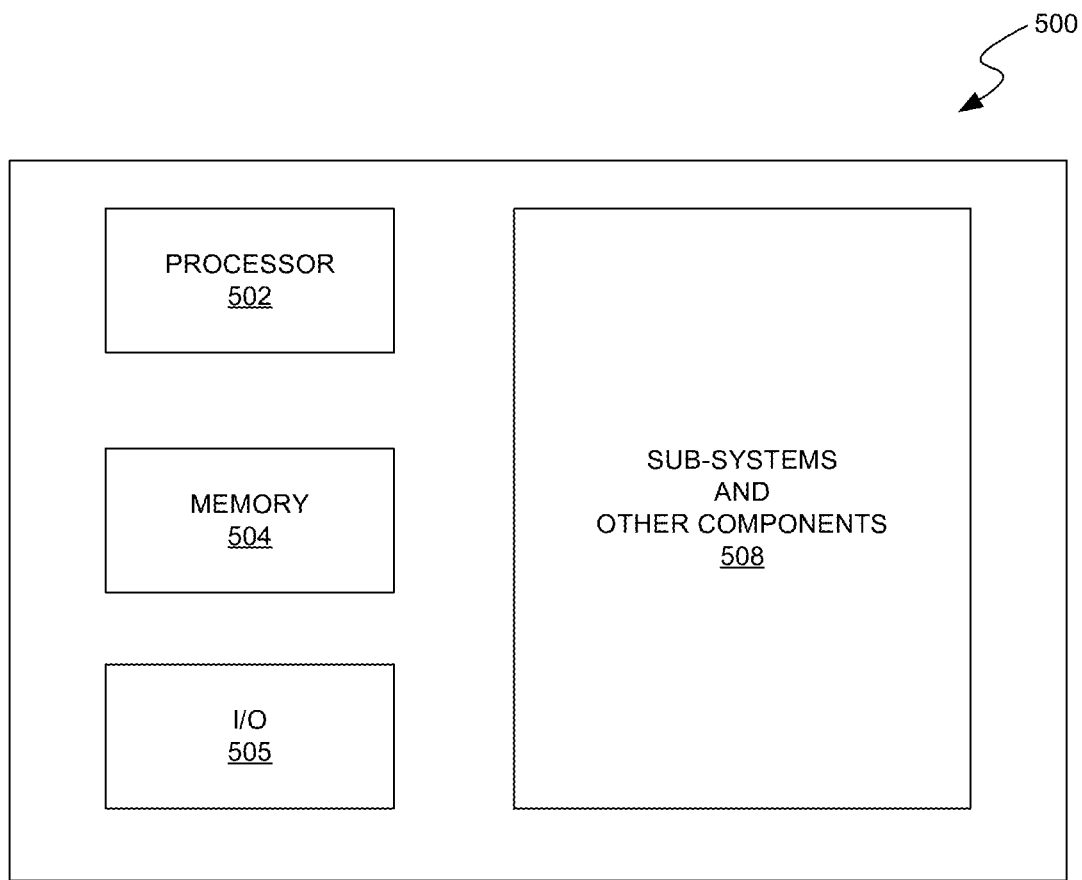
FIG. 6 is a schematic view showing a system that includes a semiconductor device assembly configured in accordance with the present technology.

Any one of the semiconductor device assemblies having the features described above (e.g., with reference to FIGS. 1-4D) can be incorporated into any of a myriad of larger and/or more complex systems, a representative example of which is system 500 shown schematically in FIG. 6. The system 500 can include a processor 502, a memory 504 (e.g., SRAM, DRAM, flash, and/or other memory devices), input/output devices 505, and/or other subsystems or components 508. The semiconductor dies and semiconductor die assemblies described above can be included in any of the elements shown in FIG. 6. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other examples, the system 500 can be housed in a single unit or distributed over multiple interconnected units, e.g., through a communication network. The components of the system 500 can accordingly include local and/or remote memory storage devices and any of a wide variety of suitable computer-readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. Reference herein to "some embodiments," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Certain aspects of the present technology may take the form of computer-executable instructions, including routines executed by a controller or other data processor. In some embodiments, a controller or other data processor is specifically programmed, configured, and/or constructed to perform one or more of these computer-executable instructions. Furthermore, some aspects of the present technology may take the form of data (e.g., non-transitory data) stored or distributed on computer-readable media, including magnetic or optically readable and/or removable computer discs as well as media distributed electronically over networks. Accordingly, data structures and transmissions of data particular to aspects of the present technology are encompassed within the scope of the present technology. The present technology also encompasses methods of both programming computer-readable media to perform particular steps and executing the steps.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

What is claimed is:

1. A semiconductor device assembly comprising:
   a substrate having a first side, a second side opposite the first side, and a substrate contact on the first side;
   a semiconductor device disposed on the first side of the substrate, the semiconductor device including an active side and a back side opposite the active side that faces the first side of the substrate;
   a fan-out porch formed separately from the semiconductor device and positioned on the substrate adjacent a lateral side of the semiconductor device;
   a wirebond contact on the fan-out porch electrically coupled to the semiconductor device; and
   a wirebond connecting the wirebond contact to the substrate contact.

2. The semiconductor device assembly of claim 1, wherein the substrate further comprises one or more contact pads at the second side of the substrate, and wherein the one or more contact pads are operably coupled to the substrate contact via one or more interconnects and/or vias within the substrate.

3. The semiconductor device assembly of claim 1, wherein the fan-out porch has a height substantially equal to a height of the semiconductor device, as measured normal to the first surface of the substrate.

4. The semiconductor device assembly of claim 1, wherein the semiconductor device further includes:
   a die pad at the active side of the semiconductor device; and
   a redistribution layer at the active side of the semiconductor device;
   wherein the redistribution layer operably couples the die pad to the wirebond contact.

5. The semiconductor device assembly of claim 1, wherein:
   the wirebond contact is a first wirebond contact,
   the fan-out porch includes a second wirebond contact,
   the wirebond is a first wirebond,
   the substrate contact is a first substrate contact, and
   the semiconductor device assembly further comprises a second wirebond connecting the second wirebond contact to the second substrate contact.

6. The semiconductor device assembly of claim 1, wherein the fan-out porch comprises an epoxy or resin.

7. A semiconductor device assembly comprising:
   a substrate having a substrate contact;
   a semiconductor device including an active side and a back side opposite the active side;
   a fan-out porch formed separately from the semiconductor device and positioned on the substrate at a lateral side of the semiconductor device,
   a redistribution layer extending over both the active side of the semiconductor device and the fan-out porch, the redistribution layer including a wirebond contact disposed over the fan-out porch, the wirebond contact being electrically coupled to the semiconductor device; and
   a wirebond operably coupling the wirebond contact to the substrate contact.

8. The semiconductor device assembly of claim 7, wherein the semiconductor device further comprises a die pad at the active side of the semiconductor device, and wherein the redistribution layer operably couples the die pad to the wirebond contact.

9. The semiconductor device assembly of claim 7, wherein the fan-out porch comprises an epoxy or resin.

10. The semiconductor device assembly of claim 7, wherein the fan-out porch has a height substantially equal to a height of the semiconductor device, as measured normal to the first surface of the substrate.

11. The semiconductor device assembly of claim 7, wherein the substrate further comprises one or more contact pads, and wherein the one or more contact pads are operably coupled to the substrate contact via one or more interconnects and/or vias within the substrate.

12. The semiconductor device assembly of claim 7, wherein:
- the wirebond contact is a first wirebond contact,
- the wirebond is a first wirebond,
- the fan-out porch includes a second wirebond contact,
- the substrate contact is a first substrate contact, and
- the semiconductor device assembly further comprises a second wirebond connecting the second wirebond contact to the second substrate contact.

13. A method of assembling a semiconductor device assembly, the method comprising:
- coupling a back side of a semiconductor device to a substrate;
- after operably coupling the back side of the semiconductor device to the substrate, forming a fan-out porch on the substrate at a lateral edge of the semiconductor device; and
- connecting a wirebond to a substrate contact on the substrate and to a wirebond contact on the fan-out porch that is electrically coupled to the semiconductor device.

14. The method of claim 13, further comprising extending a redistribution layer on the active side of the first semiconductor device onto the fan-out porch.

15. The method of claim 13, wherein the fan-out porch comprises a molding material.

16. The method of claim 13, wherein the fan-out porch has a height substantially equal to a height of the semiconductor device.

\* \* \* \* \*